United States Patent
Comstock, II et al.

(10) Patent No.: US 9,583,524 B2
(45) Date of Patent: Feb. 28, 2017

(54) OPTICAL IMAGING SYSTEM THAT INCORPORATES AN UNI-AXIAL OPTICAL HOMOGENIZER

(71) Applicant: CORNING INCORPORATED, Corning, NY (US)

(72) Inventors: Lovell Elgin Comstock, II, Charlestown, NH (US); Richard Lynton Wiggins, Keene, NH (US)

(73) Assignee: Corning Incorporated, Corning, NY (US)

( * ) Notice: Subject to any disclaimer, the term of this patent is extended or adjusted under 35 U.S.C. 154(b) by 500 days.

(21) Appl. No.: 13/905,402

(22) Filed: May 30, 2013

(65) Prior Publication Data

US 2013/0321808 A1    Dec. 5, 2013

Related U.S. Application Data

(60) Provisional application No. 61/653,668, filed on May 31, 2012.

(51) Int. Cl.
*G01J 3/28* (2006.01)
*H01L 27/146* (2006.01)
(Continued)

(52) U.S. Cl.
CPC ...... *H01L 27/14625* (2013.01); *G01J 1/0407* (2013.01); *G01J 1/0411* (2013.01);
(Continued)

(58) Field of Classification Search
CPC ...... G01J 3/2823; G01J 1/0407; G01J 1/0411; G01J 1/0474; G01J 3/0205; G01J 3/0208;
(Continued)

(56) References Cited

U.S. PATENT DOCUMENTS 3,624,421 A * 11/1971 Pantell et al. ............... 372/3
5,026,160 A *  6/1991 Dorain et al. .............. 356/328
(Continued)

FOREIGN PATENT DOCUMENTS

EP    1457806    9/2004

OTHER PUBLICATIONS

Wiggins et al. (Real-world noise in hyperspectral image systems) / Proc. Spie 8020, 802004 (May 25, 2011).*
(Continued)

*Primary Examiner* — Kara E Geisel
*Assistant Examiner* — Rufus Phillips
(74) *Attorney, Agent, or Firm* — Kevin L. Bray

(57) ABSTRACT

An optical imaging system (e.g., hyperspectral imaging system) is described herein which includes imaging optics, an uni-axial homogenizer (including a rectangular cross-section light pipe and an astigmatic paraxial optic), and a detector. The uni-axial homogenizer is configured to preserve imaging along one axis while homogenizing (removing all image information) along a second perpendicular axis. In one embodiment, the uni-axial homogenizer is utilized in a spectrograph of a hyperspectral imaging system where the rectangular cross-section light pipe replaces the entrance slit of the spectrograph and the astigmatic paraxial optic is built into the design of the spectrometer's optics.

23 Claims, 8 Drawing Sheets

(51) Int. Cl.
*G01J 3/02* (2006.01)
*G01J 1/04* (2006.01)
*G01J 3/18* (2006.01)
*G02B 27/09* (2006.01)

(52) U.S. Cl.
CPC ........... *G01J 1/0474* (2013.01); *G01J 3/0205* (2013.01); *G01J 3/0208* (2013.01); *G01J 3/0291* (2013.01); *G01J 3/18* (2013.01); *G01J 3/2823* (2013.01); *G02B 27/0911* (2013.01); *G02B 27/0961* (2013.01); *G02B 27/0994* (2013.01); *Y10T 29/49* (2015.01)

(58) Field of Classification Search
CPC ....... G01J 3/0291; G01J 3/18; G02B 27/0911; G02B 27/0994
See application file for complete search history.

(56) References Cited

U.S. PATENT DOCUMENTS

| | | | |
|---|---|---|---|
| 5,257,085 A * | 10/1993 | Ulich et al. | 356/73 |
| 6,969,177 B2 * | 11/2005 | Li | G02B 5/3025 348/E5.141 |
| 7,210,820 B2 | 5/2007 | Broude et al. | |
| 2002/0036234 A1 * | 3/2002 | Tang et al. | 235/454 |
| 2005/0228231 A1 * | 10/2005 | MacKinnon et al. | 600/180 |
| 2005/0259254 A1 * | 11/2005 | Soller et al. | 356/328 |
| 2006/0105585 A1 | 5/2006 | Jennings et al. | |
| 2006/0176912 A1 | 8/2006 | Anikitchev | |
| 2007/0252954 A1 * | 11/2007 | McGuire, Jr. | H04N 9/315 353/20 |
| 2012/0212737 A1 * | 8/2012 | Comstock et al. | 356/326 |

OTHER PUBLICATIONS

Cheng et al; "Irradiance Formations in Hollow Straight Light Pipes With Square and Circular Shapes"; J. Opt. Soc. Am. A, vol. 23, No. 2, Feb. 2006 pp. 427-434.
Cheng et al; "Optical Transfer Functions for Specific-Shaped Apertures Generated by Illumination With a Rectangular Light Pipe"; J. Opt. Soc. Am. A; vol. 23, No. 12, Dec. 2006, pp. 3123-3132.
Wiggins et al; "Real-World Noise in Hyperspectral Imaging Systems", Proc. of SPIE vol. 8020 2011 pp. 1-7.
PCT/US2013/043018 Search Report.

* cited by examiner

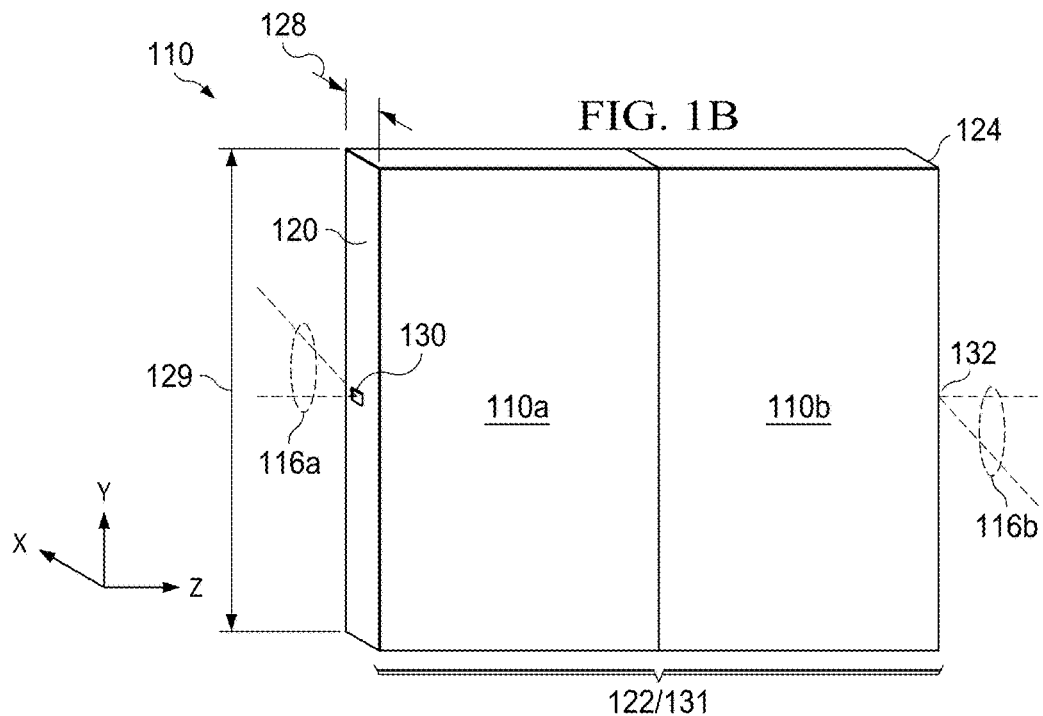
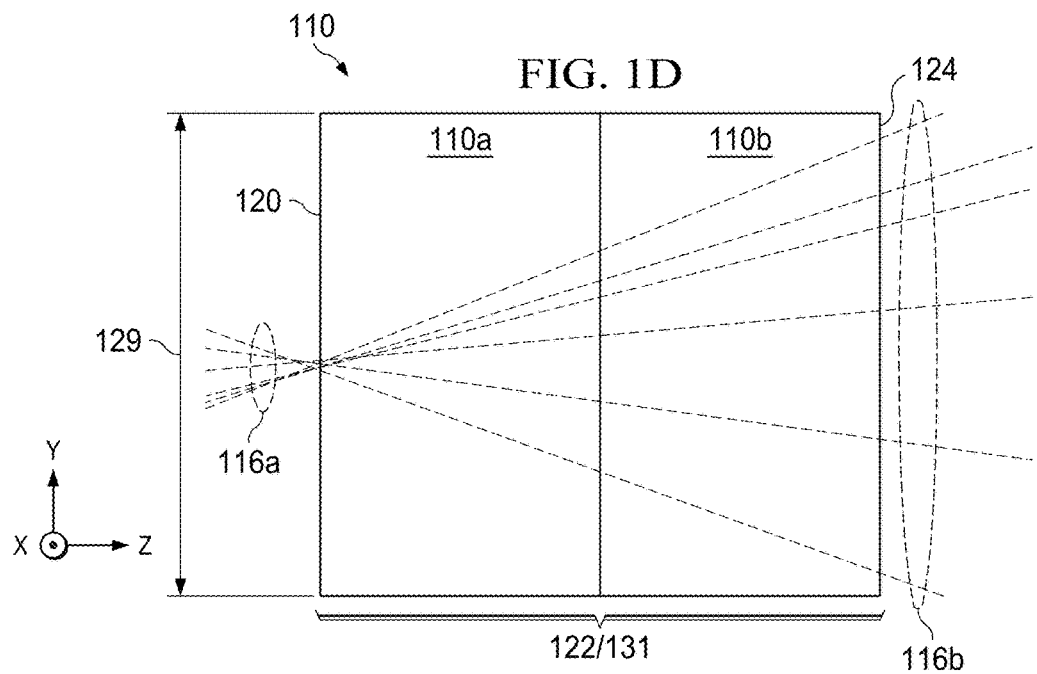

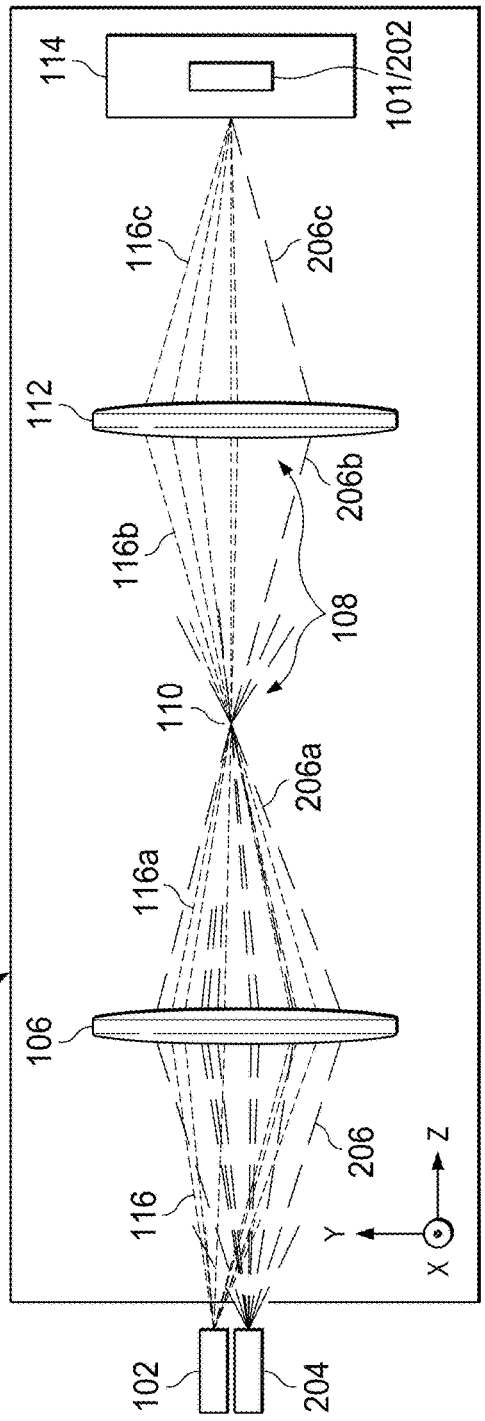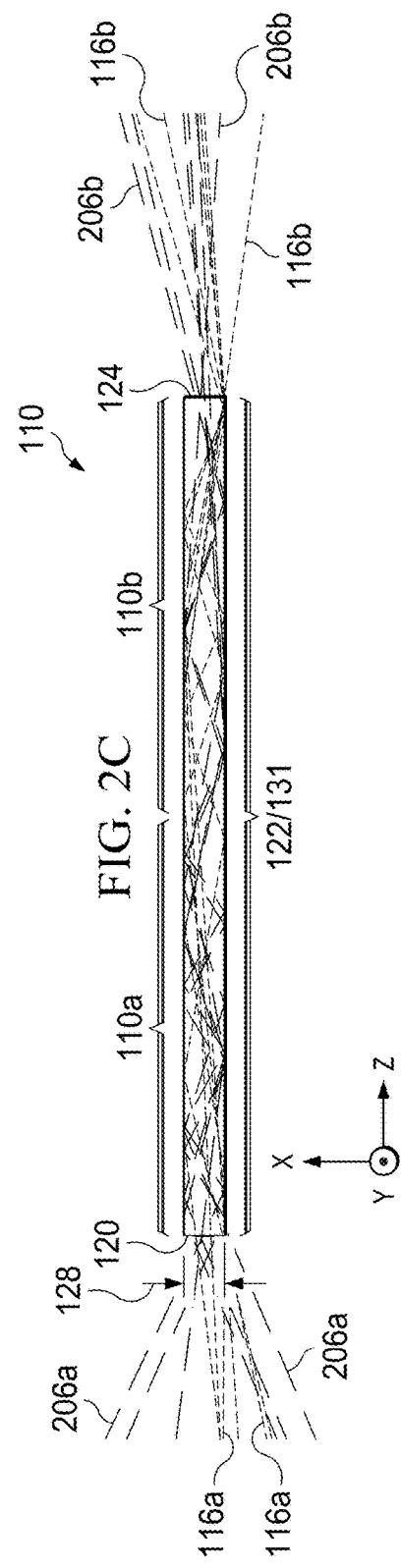

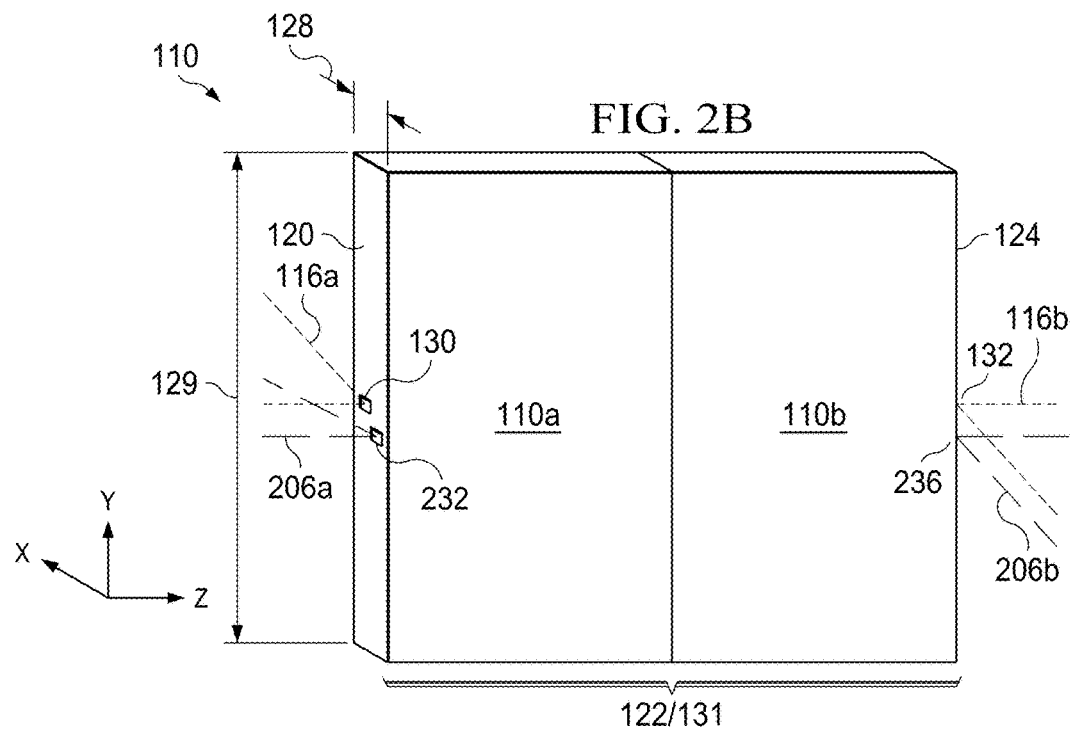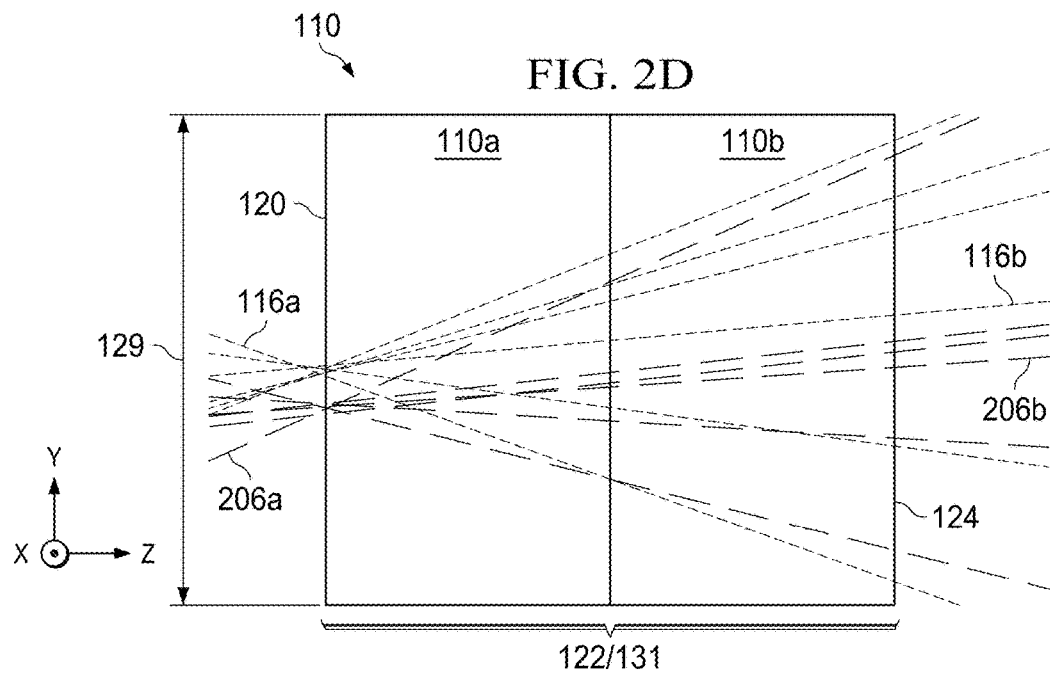

OPTICAL IMAGING SYSTEM THAT INCORPORATES AN UNI-AXIAL OPTICAL HOMOGENIZER

This application claims the benefit of priority under 35 U.S.C. §119 of U.S. Provisional Application Ser. No. 61/653668 filed on May 31, 2012 the content of which is relied upon and incorporated herein by reference in its entirety.

TECHNICAL FIELD

In general, disclosed is an optical imaging system (e.g., hyperspectral imaging system) which includes imaging optics, an uni-axial homogenizer (including a rectangular cross-section light pipe and an astigmatic paraxial optic), and a detector. The uni-axial homogenizer is configured to preserve imaging along one axis while homogenizing (removing all image information) along a second perpendicular axis. In one embodiment, the uni-axial homogenizer is used in a spectrograph of a hyperspectral imaging system where the rectangular cross-section light pipe replaces the entrance slit of the spectrograph and the astigmatic paraxial optic is built into the design of the spectrometer's optics.

BACKGROUND

Manufacturers of optical imaging systems like hyperspectral imaging systems, projectors, tracking systems and optical control systems are constantly trying to enhance such systems by tailoring the imaging to have certain properties. One way that manufacturers can enhance the optical imaging systems to make it perform better by actually making the image less perfect is the subject of the present invention.

SUMMARY

An optical imaging system, a method for manufacturing the optical imaging system, and an hyperspectral imaging system have been described in the independent claims of the present application. Advantageous embodiments of the optical imaging system, the method for manufacturing the optical imaging system, and the hyperspectral imaging system have been described in the dependent claims.

In one aspect, disclosed is an optical imaging system for providing an optical image of an object light source In one embodiment, the optical imaging system comprises: (a) imaging optics for receiving light associated with the object light source; (b) an uni-axial homogenizer including: (i) a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y-axis, and where the body has a predetermined length in a Z-axis; and (ii) an astigmatic paraxial optic positioned to receive the light associated with the object light source from the rectangular cross-section light pipe; and (c) a detector positioned to receive the light associated with the object light source from the astigmatic paraxial optic and configured to output the optical image of the object light source.

In another aspect, the present disclosure provides a method of manufacturing an optical imaging system that provides an optical image of an object light source. In one embodiment, the method comprising the steps of: (a) providing imaging optics configured to receive light associated with the object light source; (b) providing an uni-axial homogenizer including: (i) a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y-axis, and where the body has a predetermined length in a Z-axis; and (ii) an astigmatic paraxial optic positioned to receive the light associated with the object light source from the rectangular cross-section light pipe; and (c) providing a detector positioned to receive the light associated with the object light source from the astigmatic paraxial optic and configured to output the optical image of the object light source.

In yet another aspect, the present disclosure provides a hyperspectral imaging system for providing an optical image of an object light source. In one embodiment, the hyperspectral imaging system comprises: (a) imaging optics for receiving light associated with the object light source; (b) an uni-axial homogenizer including: (i) a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y-axis, and where the body has a predetermined length in a Z-axis; and (ii) an astigmatic paraxial optic positioned to receive the light associated with the object light source from the rectangular cross-section light pipe; (c) a diffraction grating positioned to receive the light associated with the object light source from the astigmatic paraxial optic; (d) a spectrometer optic positioned to receive the light associated with the object light source from the diffraction grating; and (e) a detector positioned to receive the light associated with the object light source from the spectrometer optic and configured to output the optical image of the object light source.

Additional aspects of the present disclosure will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the disclosure as disclosed.

BRIEF DESCRIPTION OF THE DRAWINGS

A more complete understanding of the present disclosure may be had by reference to the following detailed description when taken in conjunction with the accompanying drawings wherein:

FIGS. 1A-1E are diagrams associated with an exemplary optical imaging system which is configured to provide an optical image of an object light source in accordance with an embodiment of the present invention;

FIGS. 2A-2E are diagrams associated with the exemplary optical imaging system shown in FIG. 1 which instead of providing a single optical image of a single object light source is providing two optical images of two object light sources in accordance with an embodiment of the present invention.

DETAILED DESCRIPTION

Figure 1A:
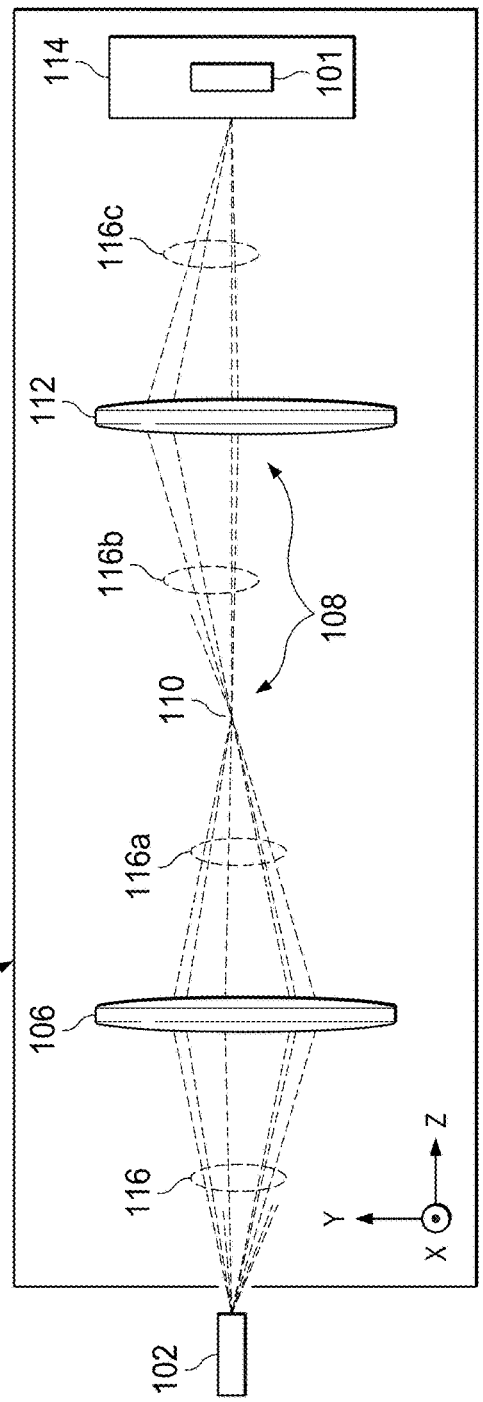

Referring to FIGS. 1A-1E, there are several diagrams used to help describe an exemplary optical imaging system 100 configured to provide an optical image 101 of an object light source 102 in accordance with an embodiment of the present disclosure. As shown in FIG. 1A, the exemplary optical imaging system 100 includes a housing 104 in which there is located imaging optics 106, an uni-axial homogenizer 108 (including a rectangular cross-section light pipe 110 and an astigmatic paraxial optic (112), and a detector 114. The imaging optics 106 (e.g., a convex-shaped lens 106, system of lenses 106) receives light 116 associated with at least a portion of the object light source 102 and outputs light 116a associated with the object light source 102. The rectangular cross-section light pipe 110 is positioned to receive the light 116a associated with the object light source 102 from the imaging optics 106 and output light 116b associated with the object light source 102 (see FIGS. 1B-1E). The astigmatic paraxial optic 112 (e.g., astigmatic paraxial lens 112) is positioned to receive the light 116b associated with the object light source 102 from the rectangular cross-section light pipe 110 and output light 116c associated with the object light source 102. The detector 114 is positioned to receive the light 116c associated with the object light source 102 from the astigmatic paraxial optic 112 and output the optical image 101 of the object light source 102 (see FIG. 1E). The optical imaging system 100 can incorporate other components which are well known to those skilled in the art but for clarity only those components which are relevant to the present disclosure are discussed in detail herein. In this regard, a detailed discussion about the uni-axial homogenizer 108 which includes the rectangular cross-section light pipe 110 and the astigmatic paraxial optic 112 is provided below with respect to FIGS. 1B-1E.

As shown in FIG. 1B, there is a perspective view of the rectangular cross-section light pipe 110 in accordance with an embodiment of the present disclosure. The rectangular cross-section light pipe 110 can be any structure that guides light rays to a specific place in one axis while providing no guidance in a second perpendicular axis. Examples are a rectangular optical waveguide using total internal reflection, a rectangular optical light pipe which is internally hollow but has reflective inner surfaces, or a series of cylindrical lens arrays. In this example, the rectangular cross-section light pipe 110 is made from two rectangular shaped sections 110a and 110b (more possible) connected so that there is no direct x-axis path, so that there is always homogenization, but it could also be made from one rectangular shaped section (not shown) with a lesser degree of homogenization.

As shown, the rectangular cross-section light pipe 110 has an entrance end 120 (which receives light 116a), a body 122, and an exit end 124 (which outputs light 116b). The entrance end 120 has a width 128 sized for homogenizing the received light 116a in an X-axis. The entrance end 120 has a height 129 sized for retaining the original spatial and angular image variations in the received light 116a in a Y-axis. The body 122 has a predetermined length 131 in a Z-axis. An exemplary way that the dimensions of the rectangular cross-section light pipe 110 can be determined or selected so as to homogenize the received light 116a in an X-axis and at the same time retain spatial and angular image variations of the received light 116a in a Y-axis is to utilize the following formula:

$$Yh(exit) >= Yh(entrance) + Z(light\ pipe)/f/\#, \quad (1)$$

where:
Z(light pipe) is the length of the light pipe 110,
Yh(exit) is the height of the exit end 124,
Yh(entrance) is the height 129 of the entrance end 120, and
1/f/# is twice a slope of a maximum angle of the light travelling within the light pipe 110.

Note: The X-axis, the Y-axis, and the Z-axis described herein and further shown in the drawings are based on the well known three-dimensional Cartesian coordinate system. Furthermore, the drawings for clarity only illustrate a small portion of the light rays associated with the light 116, 116a, 116b, and 116c.

In utilizing this formula, the Yh(entrance) of the entrance end 120 of the rectangular cross-section light pipe 110 would be selected to match the required image field which prevents vingetting. The Yh(exit) of the exit end 124 of the rectangular cross-section light pipe 110 would be selected so that the ray angles of the light 116a entering the rectangular cross-section light pipe 110 would remain unchanged in the Y-Z plane. Plus, the width 128 of the entrance end 120 of the rectangular cross-section light pipe 110 along the X-axis would be chosen to select the desired image slice. Typically, the width of the exit end 124 of the rectangular cross-section light pipe 110 along the X-axis would be identical to the width of the entrance end 120 of the rectangular cross-section light pipe 110 along the X-axis. However, in some applications it may be advantageous to change the f/# of the exit light beam 116b by having the X-width of the exit end 124 different than the X-width of the entrance end 120 of the rectangular cross-section light pipe 110.

Furthermore, the length 131 of the body 122 of the rectangular cross-section light pipe 110 along the Z-axis is chosen to provide the desired degree of homogenization. In this application, the term homogenization can be can be characterized as follows: where the rectangular cross-section light pipe's entrance end 120 receives the light 116a associated with the object light source 102 and the rectangular cross-section light pipe's body 122 homogenizes the received light 116a associated with the object light source 102 along the X-axis so that a spatial, angular, and polarization distribution of the light 116b on the X-axis which leaves the rectangular cross-section light pipe's exit end 124 is more uniform than the light 116a along the X-axis which is received at the rectangular cross-section light pipe's entrance end 120. Furthermore, in this application the term object light source can be characterized as follows: a luminous physical object or an image of such an object created by an imaging system.

Figure 1C:
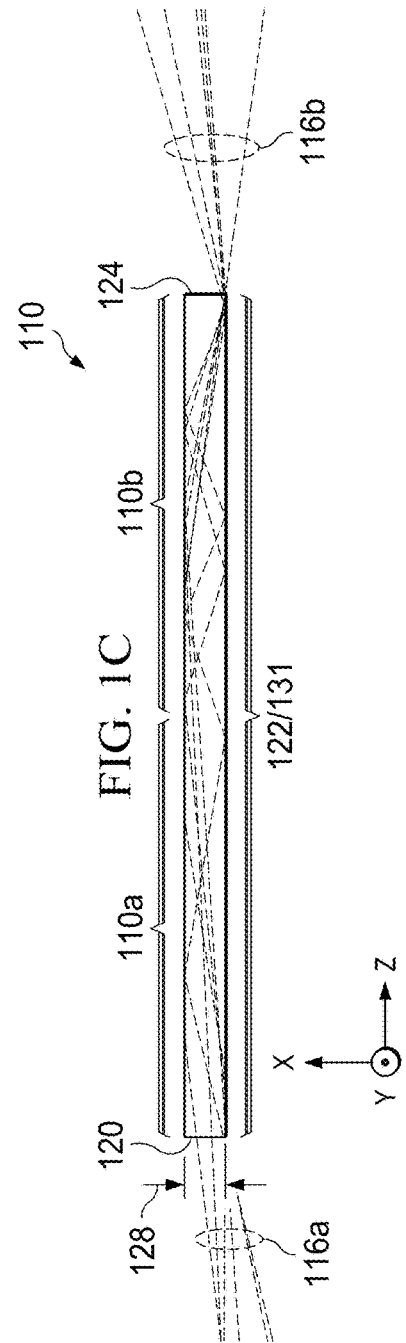

As shown in FIG. 1C, there is a top view of the rectangular cross-section light pipe 110 with respect to the XZ plane which illustrates the homogenization of the received light 116a along the X-axis. In this example, the width 128 of the rectangular cross-section light pipe 110 along the X-axis is 50 μm and the length 131 of the rectangular cross-section light pipe 100 along the Z-axis is 1 mm. The rays of the received light 116a are travelling from left to right. In referring to this drawing and FIG. 1A, one should appreciate that configuration of the astigmatic paraxial optic 112 and its position relative to the rectangular cross-section light pipe 100 are important to provide the desired optical image 101 of the object light source 102. In this regard, the astigmatic paraxial optic 112 (e.g., astigmatic paraxial lens 112) would be configured to have a YZ object plane that coincides with the entrance end 120 of the rectangular cross-section light pipe 110. The astigmatic paraxial optic 112 would have a XZ object plane that coincides with the exit end 124 of the rectangular cross-section light pipe 110. Plus, the astigmatic paraxial optic 112 would have XZ and YZ image planes which are made to coincide at the detector 114. The astigmatic paraxial optic 112 can be configured to meet all of these requirements by selecting the appropriate focal length of the astigmatic paraxial optic 112 in the YZ plane and the appropriate focal length in the XZ plane. In other words, the astigmatic paraxial optic 112 would be configured to have perfect or substantially perfect (paraxial) imaging in the YZ plane at the plane of the entrance end 120 and in the XZ plane at the plane of the exit end 124. An example of the astigmatic paraxial optic 112 could in this application be a cylindrical lens with astigmatism.

As shown in FIG. 1D, there is a magnified side view of the rectangular cross-section light pipe 110 with respect to the YZ plane which illustrates that the spatial and angular image variations of the received light 116*a* are retained along the Y-axis while also illustrating that there is no homogenization of the received light 116*a* along the Y-axis but also. In this example, the height 129 of the rectangular cross-section light pipe 110 along the Y-axis is 1 mm and the length 131 of the rectangular cross-section light pipe 100 along the Z-axis is 1 mm. The rays of the received light 116*a* are travelling from left to right.

Figure 1E:
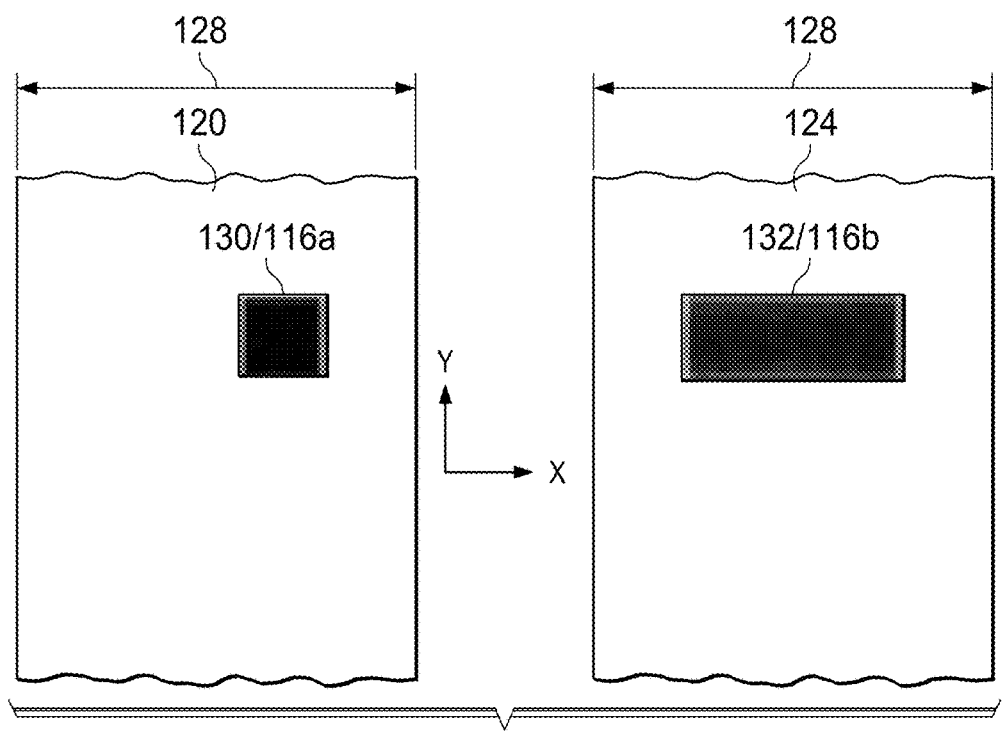

As shown in FIG. 1E, there are two partial end views of the rectangular cross-section light pipe 110 which illustrate an illumination spot 130 (received light 116*a*) at the entrance end 120 and an illumination spot 132 (output light 116*b*) obtained at the exit end 124 of the rectangular cross-section light pipe 110. In this example, the illumination spot 130 is a 20 um square in which homogenization over 50 um which corresponds to the width 128 of the entrance end 120 occurs along the X-axis. No homogenization of the illumination spot 130 occurs along the Y-axis which corresponds to the height 129 of the entrance end 120. The illumination spot 132 (output light 116*b*) at the exit end 124 of the rectangular cross-section light pipe 110 has a rectangular shape that is 20 um along the Y-axis and 50 um along the X-axis. The illumination spot 132 is what will be provided by the astigmatic paraxial optic 112 to the detector 114 to form the optical image 101 (see FIG. 1A). In this case the original square illumination spot 130 has been transformed into a rectangle of illumination 132 which retains the Y dimension of spot 130 but which is spread homogenously over the entire X dimension of the width 128.

Referring to FIGS. 2A-2E, there are several diagrams associated with the aforementioned exemplary optical imaging system 100 which instead of providing a single optical image 101 of a single object light source 102 as described above is providing two optical images 101 and 202 of two object light sources 102 and 204 in accordance with an embodiment of the present invention. In this case, the optical imaging system 100 would include the same components namely the housing 104, the imaging optics 106, the uni-axial homogenizer 108 (including the rectangular cross-section light pipe 110 and the astigmatic paraxial optic 112), and the detector 114 positioned in the same configuration as described above with respect to FIGS. 1A-1E. However, in this case the imaging optics 106 (e.g., paraxial lens 106, a convex-shaped lens 106, system of lenses 106, system of mirrors 106) in addition to receiving light 116 (short-dashed lines) associated with at least a portion of the object light source 102 also receives light 206 (long-dashed lines) associated with at least a portion of the other object light source 204 (note: the short-dashed lines and the long-dashed lines are only used to help the reader distinguish the rays of light 116 from the rays of light 206). The imaging optics 106 outputs light 116*a* and 206*a* associated with the object light sources 102 and 204. The rectangular cross-section light pipe 110 is positioned to receive the light 116*a* and 206*a* associated with the object light sources 102 and 204 from the imaging optics 106 and output light 116*b* and 206*b* associated with the object light sources 102 and 204 (see FIGS. 2B-2E). The astigmatic paraxial optic 112 (e.g., astigmatic paraxial lens 112) is positioned to receive the light 116*b* and 206*b* associated with the object light sources 102 and 204 from the rectangular cross-section light pipe 110 and output light 116*c* and 206*c* associated with the object light sources 102 and 204. The detector 114 is positioned to receive the light 116*c* and 206*c* associated with the object light sources 102 and 204 from the astigmatic paraxial optic 112 and output optical images 101 and 202 of the object light sources 102 and 204 (see FIG. 2E). A detailed discussion about the uni-axial homogenizer 108 which includes the rectangular cross-section light pipe 110 and the astigmatic paraxial optic 112 is provided below with respect to FIGS. 2B-2E.

Figure 2E:
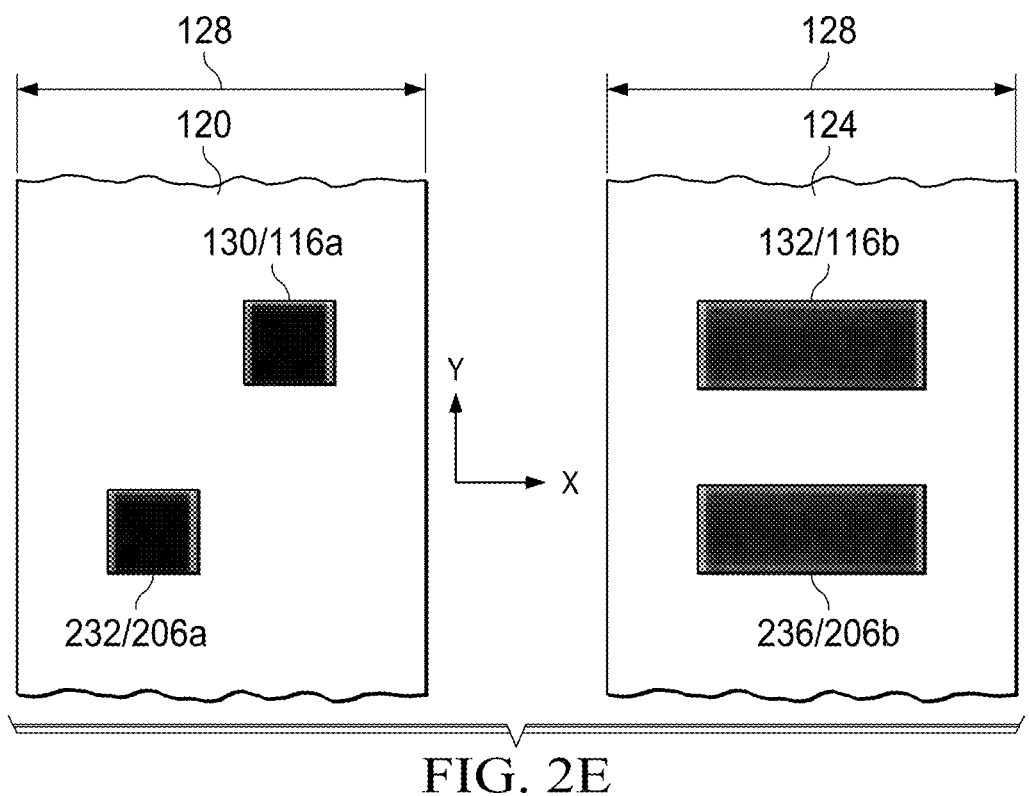

As shown in FIG. 2B, there is a perspective view of the rectangular cross-section light pipe 110 which as described above includes the entrance end 120, the body 122, and the exit end 124. In this case, the entrance end 120 receives the light 116*a* associated with the object light source 102 at the illumination spot 130 and receives the light 206*a* associated with the object light source 204 at the illumination spot 232. In FIG. 2C, the top view of the rectangular cross-section light pipe 110 with respect to the XZ plane illustrates the homogenization of the received light 116*b* and 206*a* along the X-axis. In FIG. 2D, the magnified side view of the rectangular cross-section light pipe 110 with respect to the YZ plane illustrates that the spatial and angular image variations of the received light 116*a* and 206*a* are retained along the Y-axis while also illustrating that there is no homogenization of the received light 116*a* and 206*a* along the Y-axis and also. In FIG. 2E, the two end views of the rectangular cross-section light pipe 110 illustrate the illumination spots 130 and 232 (received light 116*a* and 206*a*) at the entrance end 120 and the illumination spots 132 and 236 (output light 116*b* and 206*b*) obtained at the exit end 124 of the rectangular cross-section light pipe 110. In this example, the illumination spots 130 and 232 are both 20 um squares which are displaced 30 um along the X-axis and 60 um along the Y-axis. In this case, there was homogenization over 50 um which corresponds to the width 128 of the entrance end 120 and occurs along the X-axis. No homogenization of the illumination spots 130 and 232 occurs along the Y-axis which corresponds to the height 129 of the entrance end 120. The illumination spots 132 and 236 (output light 116*b* and light 206*b*) at the exit end 124 of the rectangular cross-section light pipe 110 have rectangular shapes that are each 20 um along the Y-axis and 50 um along the X-axis. The illumination spots 132 and 236 are what will be provided by the astigmatic paraxial optic 112 to the detector 114 to form the optical images 101 and 202 (see FIG. 2A). It should be appreciated that the optical imaging system 100 can also receive light from multiple object light sources (more than the two object light sources 102 and 204) and provide the optical images of those object light sources.

Figure 3A:
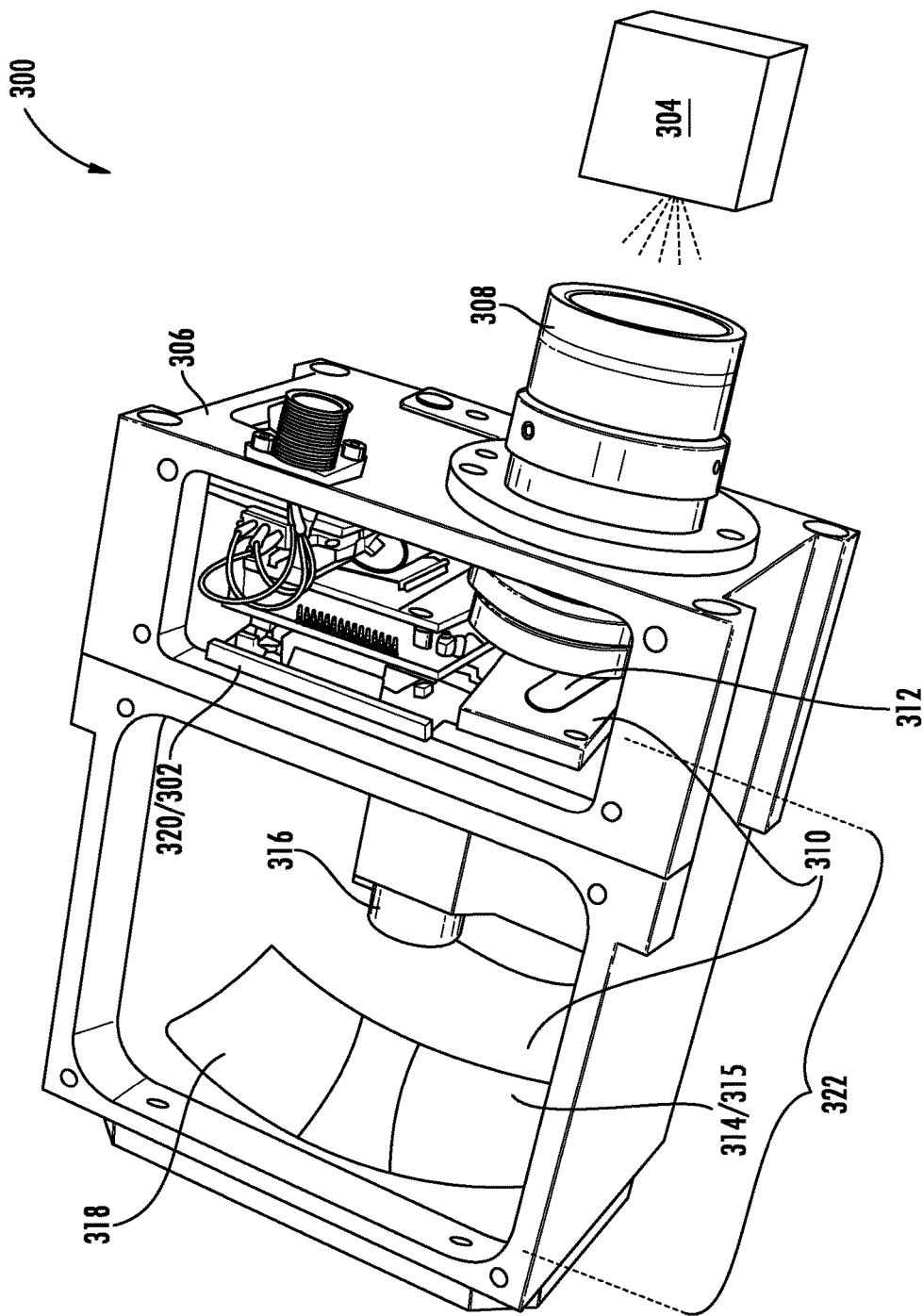
FIGS. 3A-3C are photographs illustrating the basic components of an exemplary hyperspectral imaging system configured to provide an optical image which illustrates the spectral features of an object light source in accordance with an embodiment of the present invention.
Figure 3B:
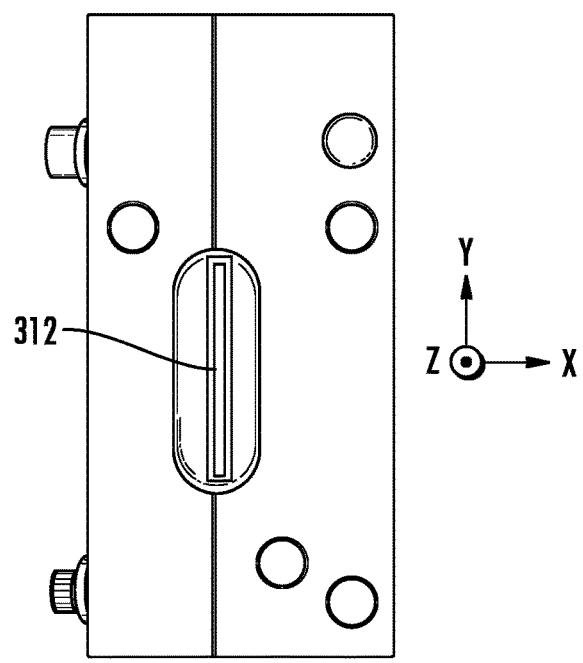
Figure 3C:
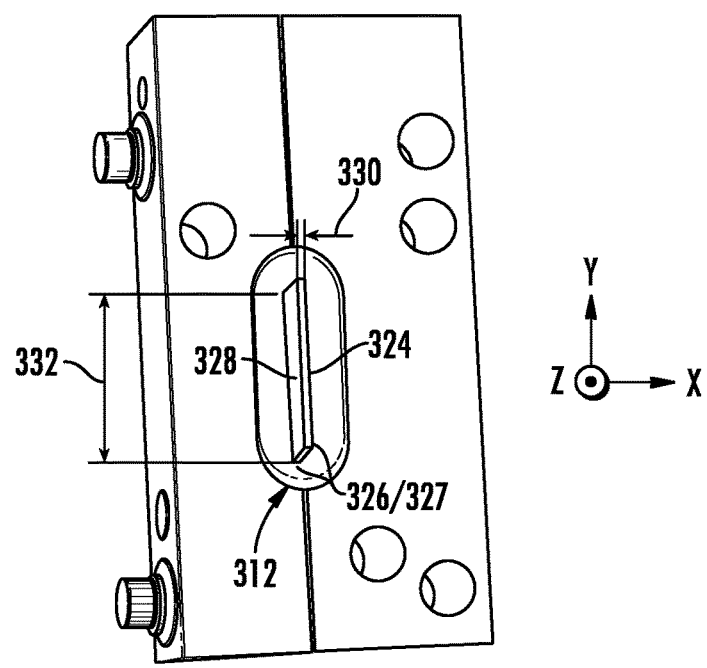

Referring to FIGS. 3A-3C, there are photographs illustrating the basic components of an exemplary hyperspectral imaging system 300 configured to provide an optical image 302 which illustrates the spectral features of an object light source 304 in accordance with an embodiment of the present invention. The exemplary hyperspectral imaging system 300 includes a housing 306 in which there is located imaging optics 308, an uni-axial homogenizer 310 (which includes a rectangular cross-section light pipe 312 and an astigmatic paraxial optic 314), a diffraction grating 316, a spectrometer optic 318, and a detector 320. The imaging optics 308 (e.g., a paraxial lens 308, a convex-shaped lens 308, system of lenses 308, system of mirrors 308) receives light associated with at least a portion of the object light source 304 and outputs light associated with the object light source 304. The rectangular cross-section light pipe 312 is positioned to receive the light associated with the object light source 304 from the imaging optics 308 and output light associated with the object light source 304 (see FIGS. 3B-3C). The astigmatic paraxial optic 314 (e.g., paraxial astigmatic imaging incorporated into an Officer primary mirror 315) is positioned to receive the light associated with the object light source 304 from the rectangular cross-section light pipe 312 and reflect light associated with the object light source 304. The diffraction grating 316 is positioned to receive the light associated with the object light source 304 from the astigmatic paraxial optic 314, diffract the light associated with the object light source 304, and reflect the diffracted light associated with the object light source 304. The spectrometer optic 318 (e.g., Officer secondary mirror 318) is positioned to receive the diffracted light associated with the object light source 304 from the diffraction grating 316 and reflect the diffracted light associated with the object light source 304. The detector 320 is positioned to receive the diffracted light associated with the object light source 304 from the spectrometer optic 318 and output the optical image 302 which illustrates the spectral features of the object light source 304.

As can be seen, the uni-axial homogenizer 310 of the present disclosure can be used in the spectrograph 322 of the hyperspectral imaging system 300. When used in the spectrograph 322, the rectangular rectangular cross-section light pipe 312 replaces the traditional entrance slit and the astigmatic paraxial optic 314 is built into the design of the traditional spectrometer optic 315. In this manner, the number of components of the spectrograph 322 remains unchanged when compared to a traditional spectrograph. It should be appreciated that the hyperspectral imaging system 300 can also incorporate other components which are well known to those skilled in the art but for clarity only those components which are relevant to the present disclosure are discussed in detail herein.

As shown in FIGS. 3B-3C, there are photographs respectively showing a front view and an angled front-side view of the rectangular-shaped rectangular cross-section light pipe 312 which is installed in the exemplary hyperspectral imaging system 300 in accordance with an embodiment of the present invention. The rectangular cross-section light pipe 312 is configured to have an entrance end 324 (which receives light associated with the object light source 304), a body 326, and an exit end 328 (which outputs light associated with the object light source 304). The entrance end 324 has a width 330 sized for homogenizing the received light in an X-axis. Furthermore, the entrance end 324 has a height 332 sized for retaining spatial and angular image variations in the received light in a Y-axis. The body 326 has a predetermined length 327 in a Z-axis. For a more detailed discussion about the rectangular cross-section light pipe 312 and how it can be designed reference is made to the rectangular cross-section light pipe 110 described above with respect to FIGS. 1A-1E. Furthermore, the astigmatic paraxial optic 314 would be configured to have a YZ object plane that coincides with the entrance end 324 of the rectangular cross-section light pipe 312. The astigmatic paraxial optic 314 would have a XZ object plane that coincides with the exit end 328 of the rectangular cross-section light pipe 312. Plus, the astigmatic paraxial optic 314 would have XZ and YZ image planes which are made to coincide at the detector XY plane (320). The astigmatic paraxial optic 314 can be configured to meet all of these requirements by selecting the appropriate focal length of the astigmatic paraxial optic 314 in the YZ plane and the appropriate focal length in the XZ plane (see FIG. 3A). In other words, the astigmatic paraxial optic 314 would be configured to have perfect or substantially perfect (paraxial) imaging in the YZ plane and in the XZ plane but the focal lengths of the astigmatic paraxial optic 314 would be different in these two planes. It should be appreciated that when an imaging system 300 like a spectrograph follows the uni-axial homogenizer 310, it is rather easy to change the optics in the imaging system so that they still serve their original function, but also serve the function of the astigmatic paraxial lens 314. Then no external astigmatic paraxial lens is needed. Hence, there are two different versions.

From the foregoing, one skilled in the art will appreciate that the present disclosure pertains to an optical imaging system 100 in general and, in one particular embodiment, to a hyperspectral imaging system 300 which incorporates a spectrograph 322. The performance of the spectrograph-based hyperspectral imaging system 300 is a marked-improvement over the state-of-the-art because the rectangular light pipe 312 replaces the traditional entrance slit and the astigmatic paraxial optic 314 is built into the design of the traditional spectrometer optic. In particular, the spectrograph-based hyperspectral imaging system 300 with the kaleidoscopic uni-axial homogenizer 310 is configured such that the illumination at the rectangular cross-section light pipe's entrance end 324 is made uniform (homogenized, scattered) across the entrance end's width (one axis, spectral axis) while being able to retain the spatial and angular image variations along the entrance end's length (perpendicular axis, spatial axis). The present invention's kaleidoscopic uni-axial homogenizer 310 is not limited to the application in a spectrograph, but it has utility in a wide-variety of devices including, for example, projectors, tracking systems, and optical control systems.

Although multiple embodiments of the present disclosure have been illustrated in the accompanying Drawings and described in the foregoing Detailed Description, it should be understood that it is not limited to the disclosed embodiments, but is capable of numerous rearrangements, modifications and substitutions without departing from the disclosure as set forth and defined by the following claims. It should also be noted that the reference to the "present disclosure" or "disclosure" used herein relates to exemplary embodiments and not necessarily to every embodiment that is encompassed by the appended claims.

The invention claimed is:

1. An optical imaging system for providing an optical image of an object light source, the optical imaging system comprising:
    imaging optics for receiving light associated with the object light source;
    an uni-axial homogenizer including:
    a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y-axis, and where the body has a predetermined length in a Z-axis; and an astigmatic paraxial optic positioned to receive the light associated with the object light source from the rectangular cross-section light pipe;

a detector positioned to receive the light associated with the object light source from the astigmatic paraxial optic and configured to output the optical image of the object light source; and, the astigmatic paraxial optic is configured to have an YZ object plane that coincides with the entrance end of the rectangular cross-section light pipe and creates a 1:1 optical image of the object light source on the detector, an XZ object plane that coincides with the exit end of the rectangular cross-section light pipe, and an XZ image plane and a YZ image plane that both coincide at the detector.

2. The optical imaging system of claim 1, wherein the rectangular cross-section light pipe includes:
the entrance end has the height in the Y-axis sized to match a desired image field at the detector;
the exit end has a height in the Y-axis sized so that angles of the light received at the entrance end remain unchanged in a YZ plane within the body of the rectangular cross-section light pipe; and
the entrance end has the width in the X-axis sized to provide a desired image slice of the object light source.

3. The optical imaging system of claim 2, wherein the height of the entrance end, the height of the exit end and the length of the body of the rectangular cross-section light pipe are sized to satisfy following:

$$Yh(exit) >= Yh(entrance) + Z(light\ pipe)\ /f\#,\ where:$$

Z(light pipe) is the length of the light pipe,
Yh(exit) is the height of the exit end,
Yh(entrance) is the height of the entrance end, and
1/f/# is twice a slope of a maximum angle of the light travelling within the rectangular cross-section light pipe.

4. The optical imaging system of claim 1, wherein the rectangular cross-section light pipe comprises one or more connected rectangular sections.

5. The optical imaging system of claim 1, wherein the rectangular cross-section light pipe comprises a rectangular optical waveguide using total internal reflection, a rectangular optical light pipe which is internally hollow but has reflective inner surfaces, or a series of cylindrical lens arrays.

6. The optical imaging system of claim 1, wherein the astigmatic paraxial optic is a cylindrical lens with astigmatism.

7. The optical imaging system of claim 1, wherein the width of the entrance end is different than a width of the exit end.

8. The optical imaging system of claim 1, wherein the imaging optics, the uni-axial homogenizer, and the detector are configured to provide an optical image of another object light source in same manner and same time as provide the optical image of the object light source.

9. The optical imaging system of claim 1, wherein the X-axis, the Y-axis, and the Z-axis are based on a three-dimensional Cartesian coordinate system.

10. The optical imaging system of claim 1, wherein the imaging optics form an image of the object light source as a square illumination spot having an X-dimension and a Y-dimension at the entrance end of the rectangular cross-section light pipe.

11. The optical imaging system of claim 10, wherein the rectangular cross-section light pipe is configured to transform the square illumination spot into a rectangular illumination spot which is present at the exit end of the rectangular cross-section light pipe, wherein the rectangular cross-section light pipe is also configured to retain the Y-dimension of the square illumination spot and homogenously spread the X-dimension of the square illumination spot over the width of the rectangular cross-section light pipe when forming the rectangular illumination spot.

12. A method of manufacturing an optical imaging system that provides an optical image of an object light source, the method comprising the steps of:
providing imaging optics configured to receive light associated with the object light source;
providing an uni-axial homogenizer including:
a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y- axis, and where the body has a predetermined length in a Z-axis; and
an astigmatic paraxial optic positioned to receive the light associated with the object light source from the rectangular cross-section light pipe; and
providing a detector positioned to receive the light associated with the object light source from the astigmatic paraxial optic and configured to output the optical image of the object light source, wherein the astigmatic paraxial optic is configured to have an YZ object plane that coincides with the entrance end of the rectangular cross-section light pipe and creates a 1:1 optical image of the object light source on the detector, an XZ object plane that coincides with the exit end of the rectangular cross-section light pipe, and an XZ image plane and a YZ image plane that both coincide at the detector.

13. The method of claim 12, wherein the step of providing the uni-axial homogenizer further includes a step of designing the rectangular cross-section light pipe such that:
the entrance end has the height in the Y-axis sized to match a desired image field at the detector;
the exit end has a height in the Y-axis sized so that angles of the light received at the entrance end remain unchanged in a YZ plane within the body of the rectangular cross-section light pipe; and
the entrance end has the width in the X-axis sized to provide a desired image slice of the object light source.

14. The method of claim 13, wherein the height of the entrance end, the height of the exit end and the length of the body of the rectangular cross-section light pipe are sized to satisfy following:

$$Yh(exit) >= Yh(entrance) + Z(light\ pipe)\ /f\#,\ where:$$

Z(light pipe) is the length of the light pipe,
Yh(exit) is the height of the exit end,
Yh(entrance) is the height of the entrance end, and
1/f/# is twice a slope of a maximum angle of the light travelling within the rectangular cross-section light pipe.

15. The method of claim 12, wherein the imaging optics, the uni-axial homogenizer, and the detector are configured to provide an optical image of another object light source in same manner and same time as they provide the optical image of the object light source.

16. The method of claim 12, wherein the X-axis, the Y-axis, and the Z-axis are based on a three-dimensional Cartesian coordinate system.

17. A hyperspectral imaging system for providing an optical image of an object light source, the hyperspectral imaging system comprising:
- imaging optics for receiving light associated with the object light source;
- an uni-axial homogenizer including:
  - a rectangular cross-section light pipe positioned to receive the light associated with the object light source from the imaging optics and configured to have an entrance end, a body, and an exit end, where the entrance end has a width sized for homogenizing the received light in an X-axis, where the entrance end has a height sized for retaining spatial and angular image variations in the received light in a Y- axis, and where the body has a predetermined length in a Z-axis; and
  - an astigmatic paraxial optic positioned to receive the light associated with the object light source from the rectangular cross-section light pipe; and
- a diffraction grating positioned to receive the light associated with the object light source from the astigmatic paraxial optic;
- a spectrometer optic positioned to receive the light associated with the object light source from the diffraction grating;
- a detector positioned to receive the light associated with the object light source from the spectrometer optic and configured to output the optical image of the object light source; and,
- the astigmatic paraxial optic is configured to have an YZ object plane that coincides with the entrance end of the rectangular cross-section light pipe and creates a 1:1 optical image of the object light source on the detector, an XZ object plane that coincides with the exit end of the rectangular cross-section light pipe, and an XZ image plane and a YZ image plane that both coincide at the detector.

18. The hyperspectral imaging system of claim 17, wherein the rectangular cross-section light pipe includes:
- the entrance end has the height in the Y-axis sized to match a desired image field at the detector;
- the exit end has a height in the Y-axis sized so that angles of the light received at the entrance end remain unchanged in a YZ plane within the body of the rectangular cross-section light pipe; and
- the entrance end has the width in the X-axis sized to provide a desired image slice of the object light source.

19. The hyperspectral imaging system of claim 18, wherein the height of the entrance end, the height of the exit end and the length of the body of the rectangular cross-section light pipe are sized to satisfy following:

$$Yh(exit) >= Yh(entrance) + Z(\text{light pipe}) / f/\#, \text{ where:}$$

Z(light pipe) is the length of the light pipe,
Yh(exit) is the height of the exit end,
Yh(entrance) is the height of the entrance end, and
1/f/# is twice a slope of a maximum angle of the light travelling within the rectangular cross-section light pipe.

20. The method of claim 12, wherein the imaging optics form an image of the object light source as a square illumination spot having an X-dimension and a Y-dimension at the entrance end of the rectangular cross-section light pipe.

21. The method of claim 20, wherein the rectangular cross-section light pipe is configured to transform the square illumination spot into a rectangular illumination spot which is present at the exit end of the rectangular cross-section light pipe, wherein the rectangular cross-section light pipe is also configured to retain the Y-dimension of the square illumination spot and homogenously spread the X-dimension of the square illumination spot over the width of the rectangular cross-section light pipe when forming the rectangular illumination spot.

22. The hyperspectral imaging system of claim 17, wherein the imaging optics form an image of the object light source as a square illumination spot having an X-dimension and a Y-dimension at the entrance end of the rectangular cross-section light pipe.

23. The hyperspectral imaging system of claim 22, wherein the rectangular cross-section light pipe is configured to transform the square illumination spot into a rectangular illumination spot which is present at the exit end of the rectangular cross-section light pipe, wherein the rectangular cross-section light pipe is also configured to retain the Y-dimension of the square illumination spot and homogenously spread the X-dimension of the square illumination spot over the width of the rectangular cross-section light pipe when forming the rectangular illumination spot.

* * * * *